United States Patent
Lee et al.

(10) Patent No.: US 6,878,617 B2
(45) Date of Patent: Apr. 12, 2005

(54) METHOD OF FORMING COPPER WIRE ON SEMICONDUCTOR DEVICE

(75) Inventors: Byung Zu Lee, Daejeon (KR); Hyun Yong Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/331,428

(22) Filed: Dec. 30, 2002

(65) Prior Publication Data

US 2003/0216040 A1 Nov. 20, 2003

(30) Foreign Application Priority Data

May 16, 2002 (KR) ................... 10-2002-0027010

(51) Int. Cl.$^7$ ..................... H01L 21/4763; H01L 21/44
(52) U.S. Cl. ............... 438/625; 438/637; 438/638; 438/645; 438/687; 438/629; 438/634
(58) Field of Search ................. 438/637, 638, 438/645, 687, 629, 634, 625, 620

(56) References Cited

U.S. PATENT DOCUMENTS

| | | | | |
|---|---|---|---|---|
| 5,547,901 A | * | 8/1996 | Kim et al. ................. | 438/652 |
| 5,677,244 A | * | 10/1997 | Venkatraman .............. | 438/643 |
| 6,100,195 A | * | 8/2000 | Chan et al. ................ | 438/687 |
| 6,103,624 A | * | 8/2000 | Nogami et al. ............ | 438/687 |
| 6,191,023 B1 | | 2/2001 | Chen | |
| 6,373,137 B1 | | 4/2002 | McTeer | |
| 6,376,353 B1 | * | 4/2002 | Zhou et al. ................ | 438/612 |
| 6,495,877 B1 | * | 12/2002 | Hsue et al. ................ | 257/306 |
| 6,521,523 B2 | * | 2/2003 | Lee et al. .................. | 438/633 |
| 6,696,760 B2 | * | 2/2004 | Powers ...................... | 257/758 |
| 6,777,318 B2 | * | 8/2004 | Jeng et al. ................. | 438/598 |
| 2002/0058408 A1 | * | 5/2002 | Maydan et al. ............ | 438/637 |
| 2003/0071355 A1 | * | 4/2003 | Dubin et al. .............. | 257/751 |

* cited by examiner

*Primary Examiner*—Matthew Smith
*Assistant Examiner*—Chuong Anh Luu
(74) *Attorney, Agent, or Firm*—Ladas & Parry LLP

(57) ABSTRACT

Disclosed is a method of forming a copper wire on a semiconductor device capable of preventing the natural oxidation of copper. The method comprises the steps of: forming an insulation film pattern having vias and trenches on a semiconductor substrate; forming a copper wire by filling up the vias and the trenches with copper; successively forming a capping layer and a protective layer on the copper wire and the insulation film pattern; exposing the copper wire by selectively removing the capping layer and the protective layer; and forming an oxidation-prevention layer on the copper wire. According to the present invention, the natural oxidation of copper is avoided by selectively depositing aluminum on a copper wire pad, and therefore a dependable evaluation is possible from tests of reliability in a high temperature. Furthermore, since aluminum has a lower contact resistance compared with copper, dependable test results are obtained during tests of electrical characteristics.

6 Claims, 5 Drawing Sheets

US 6,878,617 B2

METHOD OF FORMING COPPER WIRE ON SEMICONDUCTOR DEVICE

BACKGROUND OF THE INVENTION

1. Field of the Invention

The present invention relates to a method of forming a copper wire on a semiconductor device, and more particularly to a method of forming a copper wire on a semiconductor device that prevents the natural oxidation of copper.

2. Description of the Prior Art

Lately, semiconductor devices are becoming more integrated and their processing technologies are correspondingly being improved. Therefore, a process using copper (Cu), instead of aluminum (Al) as in the prior art, for making a wire has been proposed as an effort to make speed, resistance or parasitic capacitance between metals of the devices. Moreover, instead of an insulation film made of an oxide as used in the prior art, an insulation film made of a material with a low dielectric constant has been highlighted in the process for making wires for semiconductor devices of the next generation.

However, a wire-making process using copper and materials with low dielectric constants incurs a problem as regards the very poor etching property of copper. Accordingly, instead of conventional processes, a Damascene process (e.g., U.S. Pat. No. 5,635,423) is considered to be suitable for making copper wires.

A method of forming a copper wire for a semiconductor device according to the prior art will now be described with reference to FIGS. 1a through 1e.

First, as shown in FIG. 1a, a first insulation film 12, an etching-interruption layer 14 and a second insulation film 16 are formed successively on a semiconductor substrate 10.

Subsequently, as shown in FIG. 1b, a first photoresist pattern 18 having a width of d1 is formed on the second insulation film 16. Then, an etching process is performed using the first photoresist pattern 18 as a mask to selectively remove the second insulation film 16 until the etching-interruption layer 14 is exposed. As a result, a second insulation film pattern 16a is formed.

Next, as shown in FIG. 1c, the first photoresist pattern 18 is removed and a second photoresist pattern 20 having a width of d2 (larger than d1) is formed on the second insulation film pattern 16a.

Thereafter, as shown in FIG. 1d, an etching process is performed using the second photoresist pattern 20 as a mask to remove the etching-interruption layer 14 and the first insulation film 12 selectively. Through this process, i.e., a double Damascene process, a via hole 22 having a width of d1 and a trench hole 24 having a width of d2 are formed on the substrate 10.

Finally, as shown in FIG. 1e, the via hole 22 and the trench hole 24 are filled up with copper to complete a copper wire 26.

However, the method of forming a copper wire on a semiconductor device according to the prior art has a problem as follows.

A copper wire has various advantages over a conventional aluminum alloy (Al-0.5% Cu) wire. Representative examples are low electrical resistance and high reliability. However, the copper wire also has a drawback: the natural oxidation of copper. Such a natural oxidation of copper is problematic in that it decreases the reliability of the copper wire itself and even deteriorates the bonding property during packaging. Accordingly, proper measures are needed to avoid the natural oxidation of copper against long-term use of a device provided with copper wire at room temperature or a higher temperature.

SUMMARY OF THE INVENTION

Accordingly, the present invention has been made to solve the above-mentioned problems occurring in the prior art, and an object of the present invention is to provide a method of forming a copper wire on a semiconductor device that prevents the natural oxidation of copper by selectively depositing aluminum on the surface of a copper wire pad.

In order to accomplish this object, there is provided a method of forming a copper wire on a semiconductor device, comprising the steps of: forming an insulation film pattern having vias and trenches on a semiconductor substrate; forming a copper wire by filling up the vias and the trenches with copper; forming a capping layer and a protective layer successively on the copper wire and the insulation film pattern; exposing the copper wire by removing the capping layer and the protective layer selectively; and forming an oxidation-prevention layer on the copper wire.

The present invention prevents the natural oxidation of copper by selectively depositing aluminum on the copper wire.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
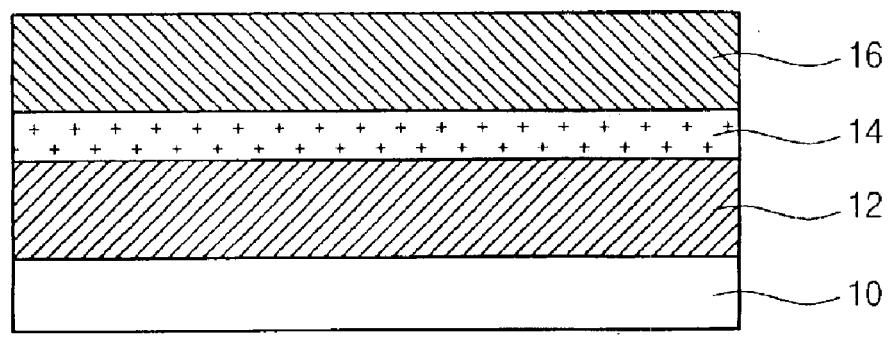
FIGS. 1a through 1e are sectional diagrams showing all the processes constituting a method of forming a copper wire on a semiconductor device according to the prior art.
Figure 1B:
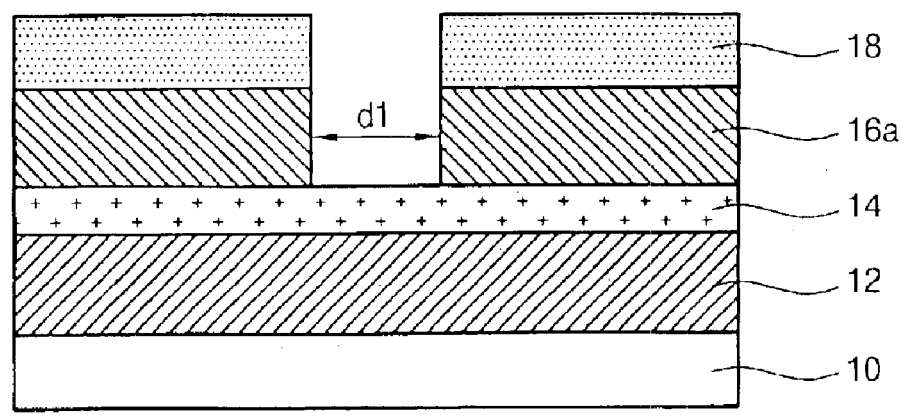
Figure 1C:
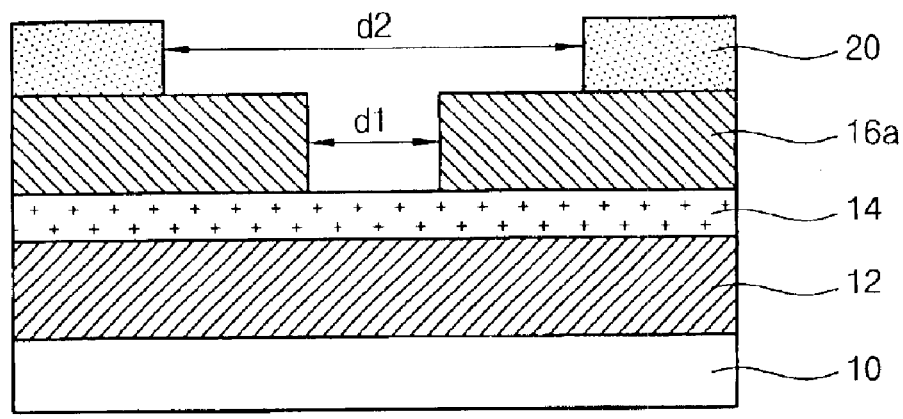
Figure 1D:
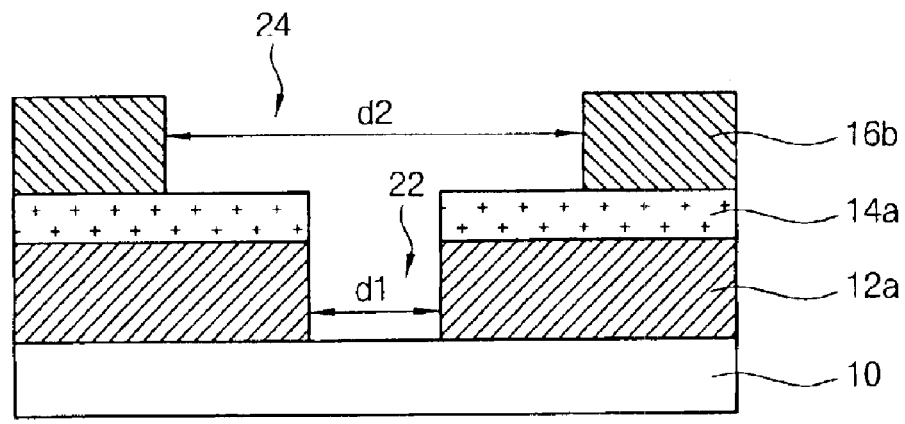
Figure 1E:
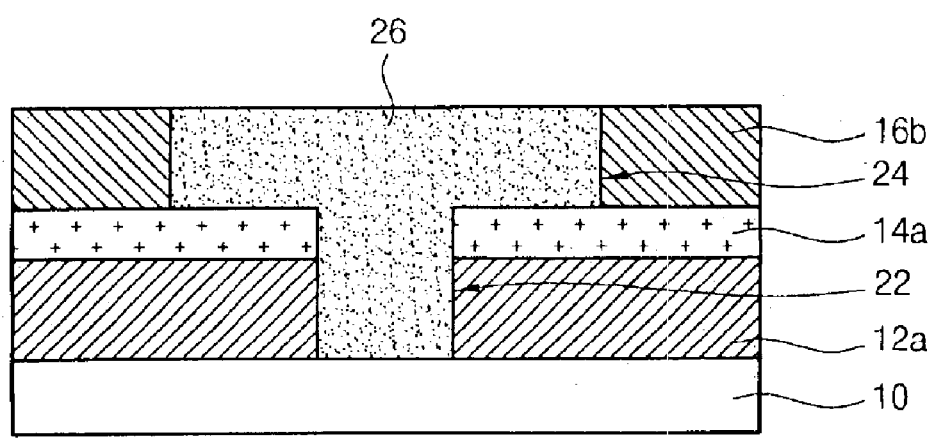

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2a through 2e are sectional diagrams showing each process constituting a method of forming a copper wire on a semiconductor device according to the present invention.

Figure 2A:
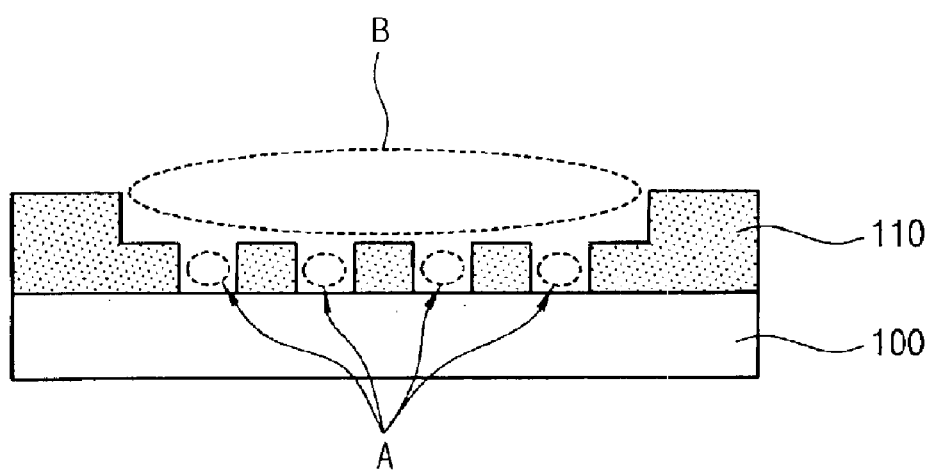
FIGS. 2a through 2e are sectional diagrams showing all the processed constituting a method of forming a copper wire on a semiconductor device according to the present invention.

First, as shown in FIG. 2a, an insulation film pattern 100 including vias A and trenches B (i.e., a double Damascene pattern) is formed on a semiconductor substrate 100. In some cases, an additional copper wire may be formed between the semiconductor substrate 110 and the insulation film pattern 110. However, it is assumed that such an additional copper wire is not formed in the embodiment of the present invention.

More specifically, the insulation film pattern 110 is formed as follows. First, an insulation film is deposited on the semiconductor substrate 100 using a material with a low dielectric constant, etc. Subsequently, the layer made of the material with a low dielectric constant is removed selectively through a photo-process to form vias A and trenches B. Then, the surfaces of the insulation film pattern 110 and the semiconductor substrate 100 are cleaned through an Argon Radio-Frequency Plasma Processing or an Argon/Hydrogen Radio Frequency Plasma Processing, etc.

Meanwhile, although not shown in the drawings, a copper barrier and a seed layer are deposited by an Ionized Physical Vapor Deposition method after the cleaning process. This method has a greatly improved step coverage compared with conventional sputtering methods. Tantalum (Ta) or tantalum nitride (TaN), etc., can be used for the copper barrier.

Figure 2B:
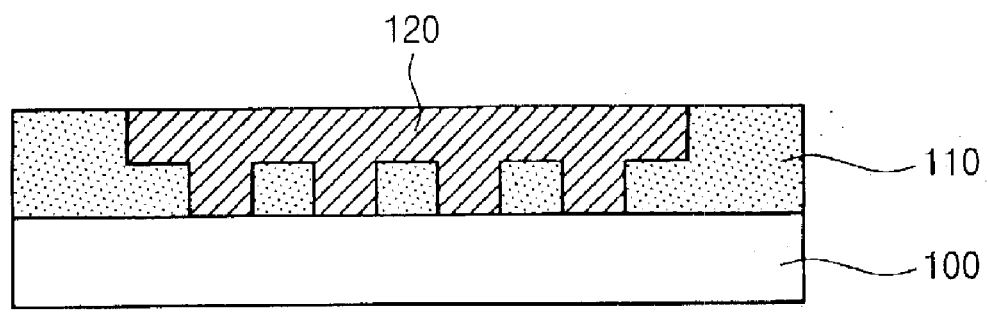

Thereafter, as shown in FIG. 2b, the vias A and the trenches B are filled up with copper by an electroplating method, etc. Next, the insulation film pattern 110 is exposed by removing a part of the copper, filling up the vias and trenches, and by performing a chemical/mechanical polishing process. Thus, a copper wire 120 is formed.

Figure 2C:
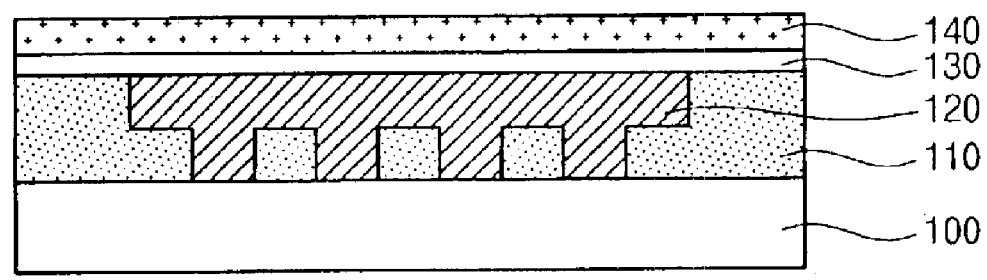

Next, as shown in FIG. 2c, the natural oxidation film (not shown) formed on the copper wire 120 is reduced. Then, a capping layer 130 and a protective layer 140 are formed on the copper wire 120 and the insulation film pattern 110 successively.

The natural oxidation film is reduced by performing a rapid heat treatment or a plasma treatment in a nitrogen/hydrogen atmosphere.

The capping layer 130 is provided to prevent the copper atoms within the copper wire 120 from diffusing into the upper layer, and it is formed by depositing, for example, silicon nitride using a Plasma-Enhanced Chemical Vapor Deposition method, without exposure to air. The diffusion of copper atoms into the upper layer causes a leakage of current among wires.

The protective layer 140 is formed by depositing a film of silicon oxide, silicon nitride, or other such material to a thickness of about 3,000 Å to 10,000 Å. When the capping layer 130 is formed of a silicon nitride film, the protective 140 is preferably formed of a silicon oxide film. If both the capping layer 130 and the protective layer 140 are formed of a silicon nitride film, excessive stress is created and, as a result, the protective layer 140 becomes defective.

Figure 2D:
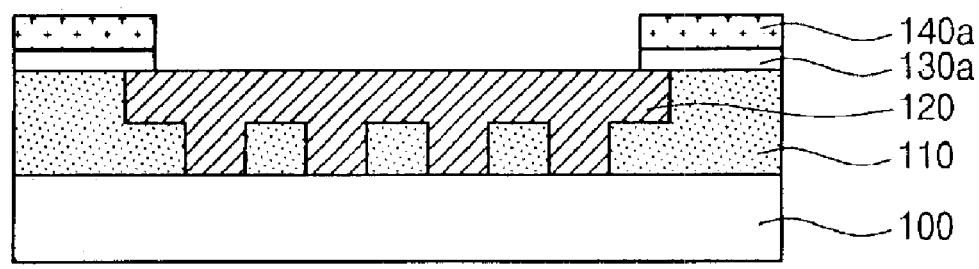

Next, as shown in FIG. 2d, the capping layer 130 and the protective layer 140 are removed selectively by exposure-to-light and an etching processes, etc., thus exposing the copper wire 120 between a capping layer pattern 130a and a protective layer pattern 140a. Additionally, a step of removing the natural oxidation film (not shown) formed on the exposed copper wire 120 through use of a cleaning solution of 5%–10% HF may be performed.

Figure 2E:
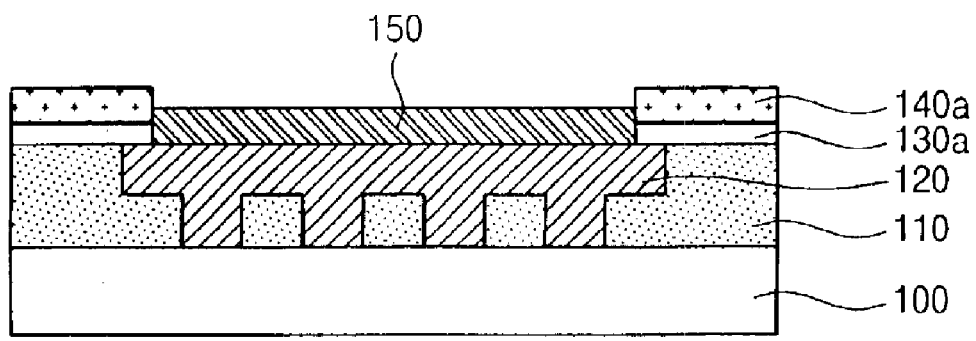

Thereafter, as shown in FIG. 2e, an oxidation-prevention layer 150 is formed on the exposed copper wire 120 by a chemical vapor deposition method to prevent the oxidation of copper. The oxidation-prevention layer 150 is formed by depositing aluminum, using, for example, dimethylaluminumhydride as a precursor. Specifically, by reacting the dimethylaluminumhydride with hydrogen, aluminum is deposited selectively on the surface of the copper wire 120 to a thickness of only 5,000 Å to 10,000 Å at a temperature of 230° C. to 350° C.

Additionally, a step of performing a heat treatment for 10–30 minutes at a temperature of 200° C. to 400° C., to stabilize the structure of the deposited aluminum layer 150, may be performed.

As explained above, a method of forming a copper wire on a semiconductor substrate according to the present invention has the following advantages.

The natural oxidation of copper is avoided by selectively depositing aluminum on a copper wire pad and therefore a stable evaluation is possible during the test of reliability in a high temperature.

Furthermore, since aluminum has a lower contact resistance compared with copper, dependable test results are obtained during tests of electrical characteristics.

Although a preferred embodiment of the present invention has been described for illustrative purposes, those skilled in the art will appreciate that various modifications, additions and substitutions are possible, without departing from the scope and spirit of the invention as disclosed in the accompanying claims. The accompanying claims are not limited by the above disclosure but include all patentable and new items inherent in the present invention, as well as all features considered equivalent by those skilled in the art.

What is claimed is:

1. A method of forming a copper wire on a semiconductor device, comprising the steps of:

forming an insulation film pattern having vias and trenches on a semiconductor substrate;

forming a copper wire by filling up the vias and the trenches with copper;

successively forming a capping layer and a protective layer on the copper wire and the insulation film pattern;

exposing the copper wire by selectively removing the capping layer and the protective layer;

forming an aluminum layer as an oxidation-prevention layer on the copper wire; and removing the natural oxidation layer on the copper wire.

2. The method as claimed in claim 1, wherein during the step of removing the natural oxidation layer, a solution of 5%–10% HF is used.

3. The method as claimed in claim 1, wherein the aluminum layer is formed by a chemical vapor deposition method using dimethylaluminumhydride as a precursor.

4. The method as claimed in claim 3, wherein the aluminum layer is deposited it a temperature of 230° C. to 350° C. and formed to a thickness of 5,000 Å to 10,000 Å.

5. The method as claimed in claim 1, further comprising the step of:

performing a heat treatment for stabilizing the structure of the oxidation-prevention layer, after the step of forming the oxidation-prevention layer.

6. The method as claimed in claim 5, wherein the heat treatment is performed for 10 to 30 minutes at a temperature of 200° C. to 400° C.

* * * * *